United States Patent [19]

Dormer

[11] Patent Number: 5,612,971
[45] Date of Patent: Mar. 18, 1997

[54] INTERMEDIATE FREQUENCY RECEIVER APPARATUS

[75] Inventor: Michael W. Dormer, Basingstoke, Great Britain

[73] Assignee: Vtech Communications, Ltd., Hong Kong

[21] Appl. No.: 252,365

[22] Filed: Jun. 1, 1994

[30] Foreign Application Priority Data

Jun. 2, 1993 [GB] United Kingdom .................. 9311297

[51] Int. Cl.$^6$ ............................ H04B 15/00; H04K 1/00; H04L 27/30
[52] U.S. Cl. ........................ 375/202; 375/350; 455/302
[58] Field of Search ..................................... 375/202, 200, 375/219, 220, 222, 316, 320, 322, 324, 340, 346, 349, 350; 455/73, 78, 76, 82, 83, 205, 206–208, 296, 302, 303; 370/24, 39, 29; 329/318, 320; 331/30, 31; 348/499

[56] References Cited

U.S. PATENT DOCUMENTS

| | | | |
|---|---|---|---|
| 4,231,116 | 10/1980 | Sekiguchi et al. ........................ | 455/87 |
| 4,476,575 | 10/1984 | Franke et al. ............................ | 455/76 |
| 4,542,531 | 9/1985 | Fukumura ................................ | 455/76 |
| 5,201,064 | 4/1993 | Bauerschmidt ........................... | 455/75 |

*Primary Examiner*—Stephen Chin
*Assistant Examiner*—Bryan Webster
*Attorney, Agent, or Firm*—Dick and Harris

[57] ABSTRACT

A transmitting and receiving system having two or more radios, each capable of transmitting and receiving a transmission signal on two or more radio frequencies where a first radio transmits on a selected frequency at a predetermined time interval and a second radio recovers the transmitted signal. The second radio has a first intermediate frequency generator which generates an intermediate frequency signal which is substantially equal to an integer multiple of the channel spacing whereby an image response corresponding to the selected frequency is separated by twice the intermediate frequency signal from the selected frequency. Thus, locations for the two or more transmission frequencies can be selected so as not to be located on the image responses corresponding to any and all of the two or more transmission frequencies.

7 Claims, 3 Drawing Sheets

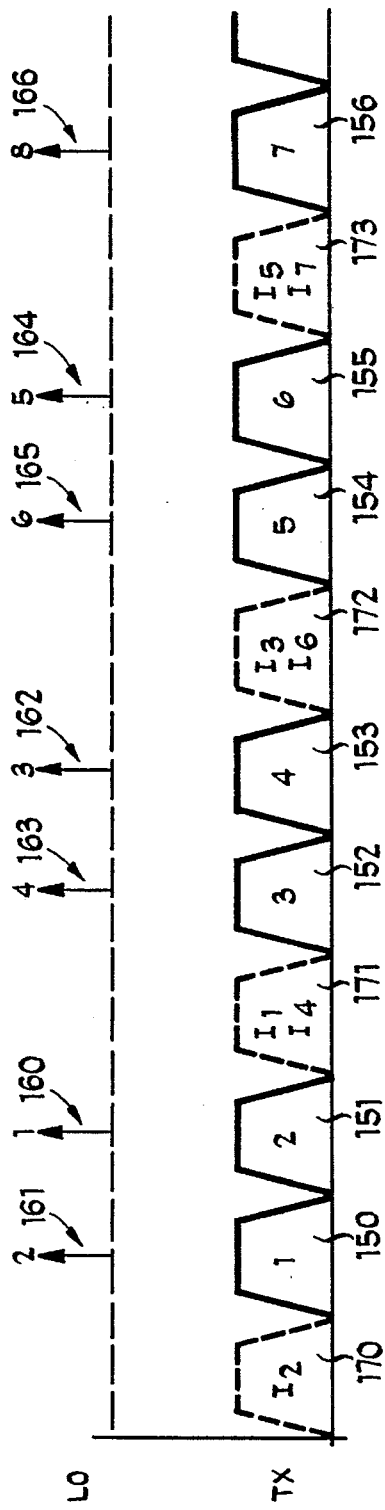

INTERMEDIATE FREQUENCY RECEIVER APPARATUS

BACKGROUND OF THE INVENTION

1. Field of the Invention

The present invention relates in general to radios and, in particular, to a transmitting and receiving system and radio transmitter/receiver apparatus to be utilized within the system, wherein the radio apparatus is capable of transmitting and receiving a transmission signal on two or more radio frequencies, such as found in a system implementing a continuous frequency hopping protocol.

2. Background Art

Radio transmitters and receivers, taking the form of cordless telephones, cellular phones, citizen band radios and the like, are well known in the art. In general, these radios particularly those that receive on multiple channels, utilize a superheterodyne receiver. Superheterodyne (also known as superhet) receivers receive a signal and mix the received signal with a local oscillator signal to, in turn, convert the received signal to a lower intermediate frequency (usually on the order of 10 MHz). Changing the local oscillator frequency tunes the receiver to permit reception of signals on various channels.

The use of a mixer to obtain the intermediate frequency introduces certain problems. The mixer accepts two signals, A and B, the received signal and the local oscillator frequency respectively, and outputs the following signals: A+B, A−B and B−A. The intermediate frequency signal results from the A−B or B−A output. The signal located at A+B will be hopelessly out of range for nominally used frequencies and is typically ignored. Even so, it can be seen that there exist two frequencies for signal A, which result in the same intermediate frequency. One value for signal A, of course, is the desired RF signal. The other is referred to as an image response. It can be seen, from the above equations that the image response's frequency is located twice the intermediate frequency from the desired RF signal's frequency.

There have been a number of approaches to removing or rejecting the image response which accompanies the desired RF signal. One such approach involved the use of tuned RF amplifiers. However, these tuned amplifiers are expensive and difficult to tune. Another approach involves the use of image-reject filters (or mixers). Image-reject filters are also expensive and frequently difficult to design.

Another approach to image rejection involves a method called "direct conversion", wherein the intermediate frequency is set to zero, i.e. the local oscillator frequency is equal to the received transmission frequency. While this approach eliminates the image problem, the processing of the resulting intermediate frequency signal is complex—requiring expensive active filters, which may have inferior noise characteristics. Furthermore, there may be local oscillator frequency reradiation in the channel.

It is, thus, an object of the present invention to provide an inexpensive approach to eliminating image signal concerns in a superhet receiver.

It is a further object of the present invention to provide a compact band-plan for a multiple channel transmitting and receiving system wherein image responses associated with the desired RF signal are positioned such that the desired RF signal is transmitted and received without interference from signals on the image response frequencies.

These and other objects will become apparent in light of the specification, drawings and claims.

SUMMARY OF THE INVENTION

A preferred embodiment of the invention comprises a transmitting and receiving system having two or more radios, each capable of transmitting and receiving a transmission signal on two or more radio frequencies wherein a first radio transmits on a selected frequency at a predetermined time interval and a second radio recovers the transmitted signal. Each of the two or more radio frequencies are separated by at least one channel spacing. Channel spacing being the minimum set frequency separation between two channels or frequencies.

The first radio includes first radio frequency generating means for generating a first selected one of the two or more radio frequencies. In a preferred embodiment, first radio frequency generating means includes a modulator filter, modulator and frequency synthesizer means which, in combination, form a modulated transmission signal.

The first radio further includes first transmission means for transmitting the transmission signal on the first selected one of the two or more radio frequencies. In a preferred embodiment, transmission means includes a power amplifying means which amplifies the modulated transmission signal and an antenna means which radiates the modulated transmission signal. This embodiment implements a time division duplexing system wherein the first and second radios transmit at one time and receive at another contiguous time interval. In this embodiment, the first transmission means further includes isolation means, which in one potential embodiment consists of an RF switch, for isolating the transmission signal from the receiver section while the transmission signal is amplified out onto the antenna means.

The second radio which recovers the transmission signal on the selected one of the two or more radio frequencies, includes first receiver means for receiving the transmission signal on the selected one of the two or more radio frequencies as transmitted by the first radio's first transmission means.

In a preferred embodiment, the first receiver means includes antenna means, isolation means and receiver amplifying means. The antenna means receives the transmission signal on the selected frequency. In this embodiment, the receiver means also includes isolation means operably connected to the antenna means for isolating the transmission signal from the transmission section of the second radio. The receiver amplifying means operably accepts the transmission signal from the antenna means via the isolation means for producing an amplified radio signal, which is the output of the first receiver means.

The second radio further includes a first intermediate frequency generating means which accepts the output from first receiver means for generating an intermediate frequency signal which is substantially equal to an integer multiple of the channel spacing.

In a preferred embodiment, first intermediate frequency generating means includes a frequency synthesizer means containing a voltage controlled oscillator for generating a desired one of the two or more radio frequencies. The frequency synthesizer means is controlled by control means which indicate to the frequency synthesizer means the desired one of the two or more local oscillator frequencies to be generated. The control means includes means for storing frequency values representing selected ones of the two or more frequencies. These selected frequencies are located at a selected integer multiple of the predetermined channel spacing from the other selected frequencies. Selecting means selects one of the frequency values representing the desired one of the two or more frequencies from the storing means.

First intermediate frequency generator means finally includes a mixer which mixes the desired one of the two or more frequencies output by the frequency synthesizer means and the transmission signal from the first receiver means producing the intermediate frequency signal. By forcing the intermediate frequency signal to be substantially equal to an integer multiple of the channel spacing, the image response corresponding to the selected one of the two or more radio frequencies is separated by twice the intermediate frequency from the first selected one of the two or more radio frequencies. Thus, channels for the two or more transmission frequencies can be selected so as not to be located on the image responses corresponding to any of the two or more transmission frequencies.

In a preferred embodiment, the integer multiple is equal to one, such that the intermediate frequency is substantially equal to the predetermined channel spacing and the frequency range is most efficiently and completely utilized.

In a preferred embodiment, the first and second radios further receive and transmit, respectively. The second radio transmits its transmission signal on a second selected one of the two or more radio frequencies at another of the predetermined time intervals which is received by the first radio. So as to provide for transmission, the second radio further includes second radio frequency generating means and second transmission means. So as to provide for reception, the first radio further includes second receiver means and intermediate frequency generating means.

In this preferred embodiment, the first selected one of the two or more radio frequencies differs from the second selected one of the two or more radio frequencies by the predetermined channel spacing. This frequency arrangement can be further utilized such that when each radio switches from receiving to transmitting mode frequency switching is not required. For instance, in the second radio, the second selected one of the two or more radio frequencies is utilized by the first intermediate frequency generator and by the second radio transmission means whereby time division duplexing is simplified.

The operation of this system essentially involves transmitting a signal on one of multiple selected transmission frequencies, which is received by another radio transmitter/receiver. The receiving radio contains a local oscillator, transmitter amplifier, isolation switch, antenna, receiver amplifier and mixer. The local oscillator is operated offset an integer number of channels from the one transmission frequency upon which the received signal was transmitted. The output of this local oscillator and the received signal output by the first receiver means are connected to the mixer, which, in turn, outputs an intermediate frequency signal. The frequency values stored in the control means have been selected as transmission frequencies to be those frequencies upon which no image response is located, thus, obviating the need for image rejection.

BRIEF DESCRIPTION OF THE DRAWINGS

FIG. 4 of the drawings is a radio frequency band plan diagram for a first radio showing, in particular, a preferred approach to locating the two or more transmission frequencies and the two or more image response frequencies corresponding thereto; and FIG. 5 of the drawings is a radio frequency band plan diagram for a second radio showing, in particular, a preferred approach to locating the two or more transmission frequencies and the two or more image response frequencies corresponding thereto.

DETAILED DESCRIPTION OF THE DRAWINGS

Figure 1:
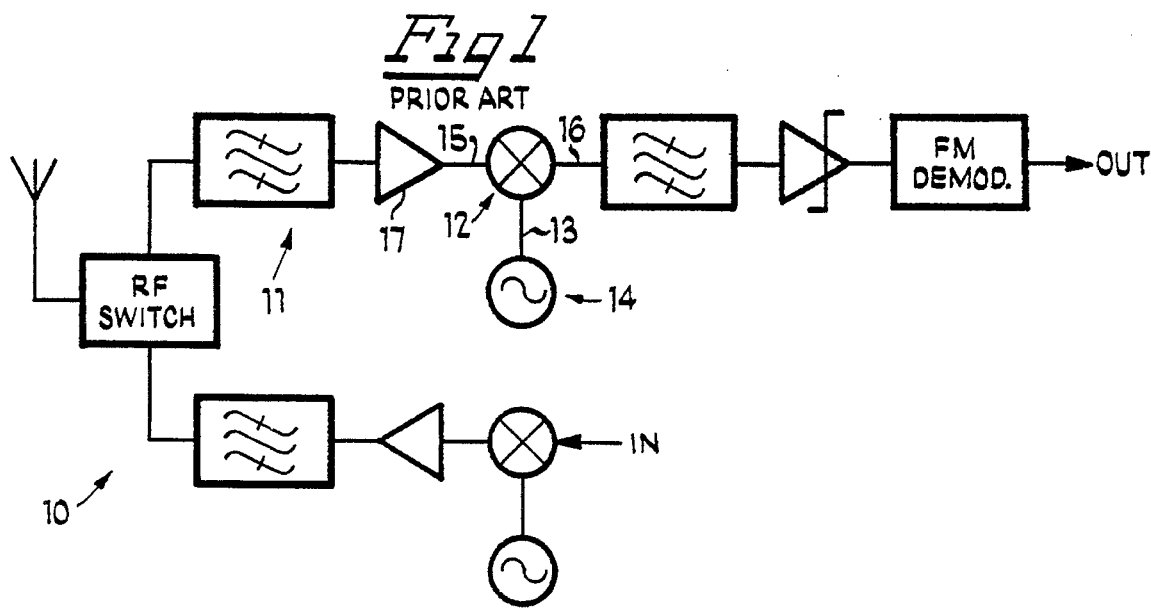
FIG. 1 of the drawings is a schematic block diagram of a prior art transmitter and superheterodyne receiver.

While this invention is susceptible of embodiment in many different forms, there is shown in the drawings and will herein be described in detail, one specific embodiment and system, with the understanding that the present disclosure is to be considered as an exemplification of the principles of the invention and is not intended to limit the invention to the embodiment and system illustrated.

FIG. 1 of the drawings is a schematic block diagram of a prior art superheterodyne receiver/transmitter 10. As discussed above, superheterodyne receivers utilize a set intermediate frequency signal to recover a received transmission signal. The generation of this set intermediate frequency signal is accomplished by mixer 12, which receives local oscillator frequency 13 from oscillator 14 and a received signal 15 from an amplifier 17. Superhet receiver 10 includes image rejection filter 11 to reject any image response. Mixer 12 will thus produce set intermediate frequency signal 16, which contains only the desired RF signal.

Figure 2:
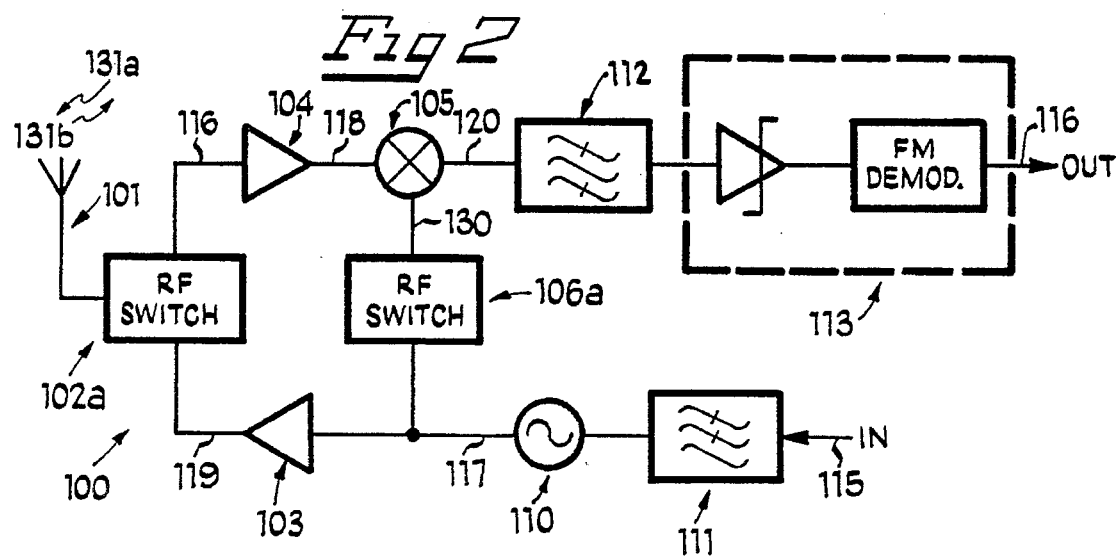
FIG. 2 of the drawings is a schematic block diagram of the invention showing, in particular, the absence of an image rejection filter.

FIG. 2 of the drawings is a schematic block diagram of radio transmitter/receiver apparatus 100. Apparatus 100 is the type of apparatus which is capable of transmitting and receiving on two or more channels. Some apparatuses of this type, including a preferred embodiment of radio transmitter/receiver apparatus 100, utilize distinct predetermined transmission and reception time intervals to time division duplex transmission and reception.

Apparatus 100, as shown in FIG. 2, is comprised of both receiver and transmitter sections. It is contemplated, that the receiver and transmitter could be two separate apparatuses; however, the additional costs associated with this separation due to various redundancies, such as two antennas and two oscillator means that would be required, may dictate against such separation.

In a preferred embodiment, transmitter/receiver apparatus 100 comprises antenna means 101, isolation means (depicted in FIG. 2 as RF switch 102a), power amplifying means 103, local oscillator generator means 110, modulation filter means 111, receiver amplifying means 104, mixer 105, intermediate filter means 112, cross-over prevention means (depicted in FIG. 2 as RF switch 106a) and signal detector 113.

Antenna means 101 radiates transmitted radio signal 131b during predetermined transmission time intervals and receives the received radio signal 131a during predetermined reception time intervals. Antenna means 101 may be of the conventional type utilized in cordless telephones, cellular telephones or other types of radios. Antenna means 101 is operably connected to isolation means, which as shown in FIG. 2 in a preferred embodiment consists of RF switch 102a. The isolation means may comprise any element or set of elements that isolates the receiver section of apparatus 100 from the transmitter section, as is standard in the art. Of course, where apparatus 100 would be implemented as a separate receiver and transmitter, each would require separate antenna means 101, and the isolation means could be omitted.

The transmitter section of apparatus 100 accepts modulating signal 115 containing the information to be transmitted, which may consist of voice and/or data signals. This modulating signal 115 may be generated by a microphone or even a digital circuit, in the case of digital communications. Modulating signal 115 is fed into modulator filter means 111 which shapes the modulation of modulating signal 115 to fit the transmission channel. The output of modulation filter means 111 is fed into a modulator (not shown) which interacts with local oscillator generator means 110 to produce transmission signal 117.

Figure 3:
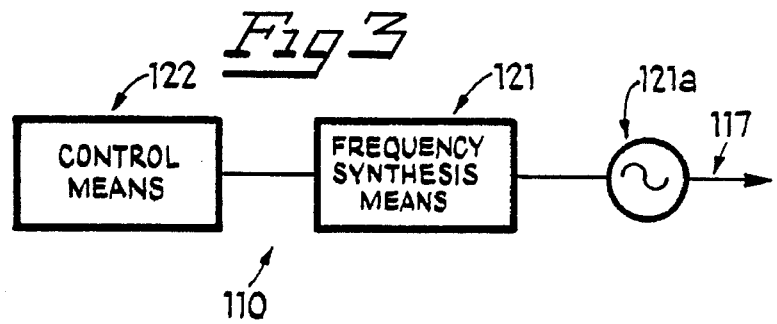
FIG. 3 of the drawings is a schematic block diagram of the local oscillator frequency generator means showing, in particular, a frequency synthesizer, a voltage controlled oscillator and a control means.
Figure 3A:
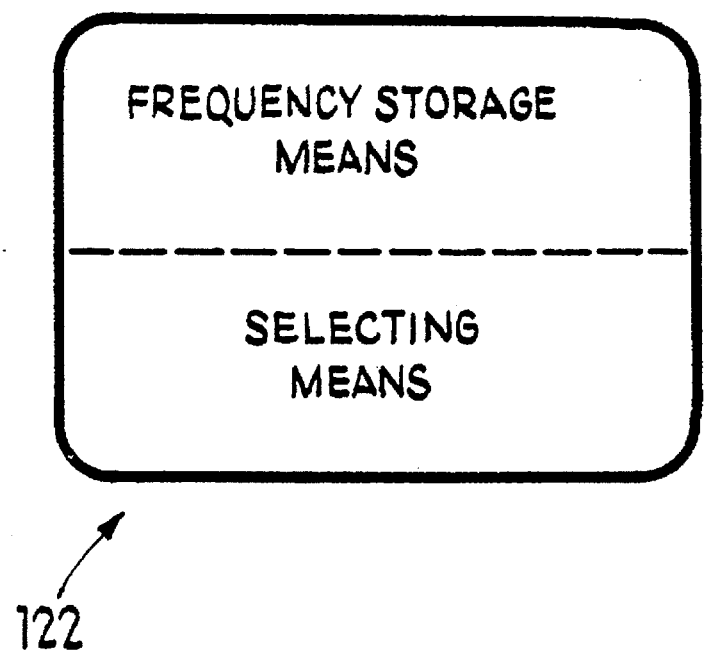
FIG. 3A of the drawings is a block diagram showing further detail of the control diagram means of FIG. 3.

Local oscillator generator means 110, as shown in FIG. 3, includes frequency synthesizer means 121. Frequency synthesizer means 121, which includes voltage controlled oscillator 121a, generates the local oscillator frequency. This local oscillator frequency is selected by control means 122, which is operably connected to frequency synthesizer means 121. As shown in FIG. 3A, control means 122 includes means for storing frequency values representing selected ones of the two or more frequencies. The selected frequencies are located a selected integer multiple of the predetermined channel spacing from each other. These values are selected from the storing means by selecting means, which is operably connected to the storing means.

The transmitting section of radio transmitter/receiver apparatus 100 further includes power amplifying means 103 for accepting and amplifying modulated transmission signal 117 generated by the modulator and local oscillator generator means 110 toward outputting amplified radio signal 119. Power amplifying means 103 is operably connected to the isolation means (depicted as RF switch 102a) toward transmitting amplified radio signal 119 via antenna means 101 as transmitted radio signal 131b.

The receiver section of radio transmitter/receiver apparatus 100 includes receiver amplifying means 104, mixer 105 and selective matching means. Antenna means 101 receives received radio signal 131b from another radio apparatus (not shown) transmitted at a selected one of the transmission frequencies. Received radio signal 131a is operably accepted by receiver amplifying means 104 via the isolation means (depicted as RF switch 102a) toward producing an amplified radio signal 118.

The receiver section further includes first intermediate frequency generating means, which in a preferred embodiment comprises local oscillator generator means 110 and mixer 105. Local oscillator generator means 110 is also utilized by the transmission section of apparatus 100, but given the time division duplex nature of apparatus 100 there is no inherent problem. In fact, as will be described later there is an inherent benefit from sharing local oscillator generator means 110—beyond the cost benefits.

First intermediate frequency generating means generates intermediate frequency signal 120, which has a frequency substantially equal to an integer multiple of the channel spacing, whereby an image response corresponding to the transmission frequency is separated by twice the intermediate frequency from the transmission frequency. Because the locations of the image responses are "in-band" at known locations, the two or more radio transmission frequencies can be selected so as not to be located on the image responses corresponding to any and all of the two or more radio transmission frequencies. These values are stored in control means 122 and are utilized as described above.

Mixer 105 accepts amplified radio signal 118 and local oscillator generator means output 130 and produces intermediate frequency signal 120. Intermediate frequency signal 120 has a frequency substantially equal to the difference between the frequency of the received transmission signal 131b and local oscillator generator means output 130. Local oscillator generator means output 130 is the second selected one of the two or more radio frequencies which corresponds to received radio signal 131a which has a first selected one of the two or more radio frequencies, such that the frequency of intermediate frequency signal 120 is substantially equal to an integer multiple of the predetermined channel spacing.

The receiver section finally includes intermediate filter means 112 connected to the output of mixer 105 for passing intermediate frequency signal 120 to signal detector 113, which includes a limiting amplifier and FM detector.

One embodiment of the invention may include a cross-over prevention means operably connected between local oscillator generator means 110 and mixer 105 for preventing the introduction of transmission signal 117 into the receiver section. In a preferred embodiment, the cross-over prevention means comprises RF switch 106a. During predetermined transmission time intervals, RF switch 106a is open so as to prevent modulated transmission signal 117 from entering mixer 105. During predetermined reception time intervals, RF switch 106a is closed so as to allow local oscillator generator means 110 to operate in conjunction with mixer 105 so as to provide first intermediate frequency signal generating means. In a preferred embodiment, during predetermined reception time intervals there is no modulating signal 115 such that transmission signal 117 solely consists of the frequency generated by local oscillator generator means 110.

In operation, two or more radio transmitter/receiver apparatuses 100 may be deployed and in communication within one another. One such exemplary system is that of a frequency hopping cordless telephone system. In this system, the selection means of control means 122, relying on timing, at predetermined time intervals selects a first selected one of the frequencies. The selected frequency is dependent upon a predetermined pseudo-random code, known by all the radios in the system.

A second radio recovers the transmission signal on the first selected frequency by selecting a second selected one of the two or more radio frequencies which corresponds to the first selected one of the two or more radio frequencies such that the intermediate frequency signal generated by the first intermediate frequency signal generating means is an integer multiple of the channel spacing. It is assumed that the first and second radios are synchronized such that this selective correspondence can be accomplished based upon a pseudo-random code known to both of the radios. Where the integer multiple equals one, i.e. the channel spacing equal the intermediate frequency, a radio frequency band-plan like the one shown in FIGS. 4 and 5 is utilized.

FIG. 4 is a radio frequency band plan diagram for the first radio and FIG. 5 shows the plan for the second radio with the corresponding frequencies generated by the receiving radio, second and first radios, respectively, overlaid thereon.

Transmission channels 150–156 are each utilized at predetermined transmission time intervals to transmit a signal from the first radio to the second radio. The second radio receives the transmitted signal and generates an intermediate frequency signal utilizing the corresponding one of the two or more radio frequencies 160–166, wherein selected radio frequency 160 corresponds to transmission channel 150 and is generated at the second radio's predetermined reception time interval—the same time as first radio's predetermined transmission time interval. As can be seen from FIG. 4, each selected radio frequency is one channel spacing away from its corresponding channel. Thus, resulting in an intermediate frequency substantially equal to the channel spacing whereby image response 171, which corresponds to the selected radio frequency, is twice the intermediate frequency away from the transmission channel frequency. Thus, locations for the two or more transmission frequencies can be selected so as not to be located on the image responses corresponding to any and all of the transmission frequencies. So due to transmission frequencies 150 –156 image responses 170–173 will exist in known "in-band" locations such that transmission frequencies 150–156 can be selected so as not to be located on any of image responses 170–173.

The frequency band plan for the second radio, as shown in FIG. 5, is a mirror image of the band plan for the first radio, shown in FIG. 4. This reflection simplifies the time division duplexing utilized in the transmission and reception system. For example, in the first time interval, the first radio may transmit on channel three 152. Assuming the second radio is in sync with the first it will be generating selected radio frequency three 162, such the resulting intermediate frequency signal will have a frequency equal to the channel spacing.

In the second time interval, the second radio transmits on channel three 182 and first radio will generate selected radio frequency three 192. FIGS. 4 and 5 have the same scale and their axes are aligned, such that, it can be seen that first radio in "moving" from transmitting on channel three 152 to receiving utilizing selected radio frequency three 192, the frequency generated by local oscillator generator means 110 does not change. Thus, switching between transmission and reception occurs with no delay with the same no-delay-switch occurring in the second radio because of the transmission-selected radio frequency pairing.

As can be further be seen in FIGS. 4 (and 5), the image responses corresponding to transmission frequencies 150–156 are overlapped into four response locations. This overlap results from the interrelation of the transmission-selected radio frequency pairs themselves and to each other and because the chosen integer multiple is one. In a system utilizing the integer multiple of two or three, the band plan will not be compact and the image responses will not overlap as readily.

It is contemplated that this transmission and reception system be utilized within a frequency hopping system, wherein hopping would occur between pairs after a single time division duplexing switch occurs (i.e. both the first and second radios transmit once before the sequence continues onto another pair).

The foregoing description and drawings merely explain and illustrate the invention and the invention is not limited thereto except insofar as the appended claims are so limited and as those skilled in the art who have the disclosure before them will be able to make modifications and variations therein without departing from the scope of the invention.

What is claimed is:

1. An apparatus for making image rejection in a superheterodyne receiver substantially unnecessary, said superheterodyne receiver receiving a transmission signal, said superheterodyne receiver an antenna operably connected to a mixer the output of said mixer being operably connected to a signal detector having an output, said apparatus comprising:

two or more radio frequencies on one of which said transmission signal is sent, each of the two or more radio frequencies being separated from one another by at least one predetermined channel spacing, each of said two or more radio frequencies being selected from available radio frequencies;

two or more local oscillator frequencies, each one of said two or more local oscillator frequencies being separated from a corresponding one of said two or more radio frequencies by an integer multiple of said predetermined channel spacing;

said available radio frequencies consisting of the group of radio frequencies which are not located at any frequency occupied by an image response of a previously selected one of said two or more radio frequencies;

means for one of said two or more local oscillator frequencies corresponding to said one of said two or more radio frequencies on which said transmission signal is being sent;

a frequency generator operably connected to said mixer, said frequency generator generating said one of said two or more local oscillator frequencies corresponding to said one of said two or more radio frequencies on which said transmission signal is being sent;

wherein said selecting means selects said two or more local oscillator frequencies based upon a time-based sequence, said time-based sequence is pseudo-random code known to both said superheterodyne receiver and a transmitter transmitting said transmission signal and synchronized to said superheterodyne receiver.

2. The invention according to claim 1 wherein said frequency generator means comprises:

frequency synthesizer means including a voltage controlled oscillator for generating a desired one of said two or more local oscillator frequencies; and control means operably connected to said frequency synthesizer means for indicating to said frequency synthesizer means said desired one of the two or more local oscillator frequencies to be generated, said control means comprising:

means for storing frequency values representing selected ones of the two or more frequencies, said selected ones being located a selected integer multiple of said predetermined channel spacing from each other of the selected ones, selecting means operably connected to said storing means for selecting one of said frequency values representing said desired one of the two or more local oscillator frequencies from said storing means.

3. The invention according to claim 1 wherein said integer multiple spacing is equal to one, such that said intermediate frequency is substantially equal to the predetermined channel spacing so as to provide complete utilization of the two or more frequencies within said range.

4. An apparatus for making image rejection in a superheterodyne receiver substantially unnecessary, said superheterodyne receiver receiving a transmission signal, said superheterodyne receiver including an antenna operably connected to a mixer the output of said mixer being operably connected to a signal detector having an output, said apparatus comprising;

two or more radio frequencies on one of which said transmission signal is sent, each of the two or more radio frequencies being separated from one another by at least one predetermined channel spacing, each of said two or more radio frequencies being selected from available radio frequencies;

two or more local oscillator frequencies, each one of said two or more local oscillator frequencies being separated from a corresponding one of said two or more radio frequencies by an integer multiple of said predetermined channel spacing;

said available radio frequencies consisting of the group of radio frequencies which are not located at any frequency occupied by an image response of a previously selected one of said two or more radio frequencies selected such that said image response of each of said two radio frequencies are overlapped resulting in a more compact frequency band plan;

means for selecting one of said two or more local oscillator frequencies corresponding to said one of said two or more radio frequencies on which said transmission signal is being sent;

a frequency generator operably connected to said mixer, said frequency generator to said one of said two or more local oscillator frequencies corresponding to said one of said two or more radio frequencies on which said transmission signal is being sent.

5. The invention according to claim 4 wherein said integer multiple is one.

6. A method of transmitting and receiving radio signals in a manner minimizing interference between received radio signals and associated image responses in a system having:

two or more radio transmitter/receivers which communicate with one another, each of the radio transmitter/receivers being capable of transmitting and receiving signals between one other on two or more radio frequencies, each frequency comprising a communication channel, each radio transmitter/receiver containing a local oscillator, transmitter amplifier, isolation switch, antenna, receiver amplifier and mixer, the method the steps of;

transmitting the signal from one of the two or more radio transmitter/receivers on one of multiple selected transmission frequency;

receiving the signal in at least one other of the two or more radio transmitter/receivers on the one transmission frequency;

operating the local oscillator associated with each of said at least one other of the two or more radio transmitter/ receivers offset an integer number of channels from the one transmission frequency upon which the received signal was transmitted, the output of the local oscillator and the received signal was connected to the mixer the output of which comprises an intermediate frequency signal;

selecting as transmission frequencies only those frequencies upon which no image response is located such that the image responses associated with the transmission frequencies do not interfere with the intermediate frequency signals; and such that said image responses of two or more radio frequencies are overlapped resulting in a more compact frequency band plan.

7. The invention according to claim 6 comprising the additional steps of:

transmitting a second signal from the at least one other of the two or more radio transmitter/receivers on the local frequency at which the local oscillator was operated;

receiving the second signal in the one of the two or more radio transmitter/receivers on the local frequency; and operating the local oscillator associated with the one of the two or more radio transmitter/receivers at the one transmission frequency, the output of the local oscillator and the received being connected to the mixer the output of which comprises an intermediate frequency signal.

* * * * *

UNITED STATES PATENT AND TRADEMARK OFFICE
CERTIFICATE OF CORRECTION

PATENT NO. : 5,612,971
DATED : March 18, 1997
INVENTOR(S) : Michael W. Dormer

It is certified that error appears in the above-indentified patent and that said Letters Patent is hereby corrected as shown below:

Col. 10. line 3      After "the method" insert -- comprising the" and after "of" delete ";" and insert instead --:--.

Col. 10. line 16      After "signal" delete "was" and insert instead --being--.

Signed and Sealed this

Twenty-seventh Day of January, 1998

Attest:

BRUCE LEHMAN

*Attesting Officer*      *Commissioner of Patents and Trademarks*